United States Patent
Rim et al.

(10) Patent No.: US 9,812,592 B2
(45) Date of Patent: Nov. 7, 2017

(54) METAL-FOIL-ASSISTED FABRICATION OF THIN-SILICON SOLAR CELL

(71) Applicants: Seung Bum Rim, Palo Alto, CA (US); Gabriel Harley, Mountain View, CA (US)

(72) Inventors: Seung Bum Rim, Palo Alto, CA (US); Gabriel Harley, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 947 days.

(21) Appl. No.: 13/725,580

(22) Filed: Dec. 21, 2012

(65) Prior Publication Data

US 2014/0174519 A1    Jun. 26, 2014

(51) Int. Cl.
| | |
|---|---|
| H01L 31/0216 | (2014.01) |
| H01L 31/02 | (2006.01) |
| H01L 31/0224 | (2006.01) |
| H01L 31/068 | (2012.01) |
| H01L 31/18 | (2006.01) |

(52) U.S. Cl.
CPC .... *H01L 31/0216* (2013.01); *H01L 31/02002* (2013.01); *H01L 31/022425* (2013.01); *H01L 31/022441* (2013.01); *H01L 31/0682* (2013.01); *H01L 31/1896* (2013.01); *Y02E 10/547* (2013.01)

(58) Field of Classification Search
CPC ............ H01L 31/0216; H01L 31/0682; H01L 31/1896; H01L 31/02002; H01L 31/022425; H01L 31/022441

USPC ............... 438/64, 98; 136/242–265
See application file for complete search history.

(56) References Cited

U.S. PATENT DOCUMENTS

| | | | |
|---|---|---|---|
| 4,321,299 A | 3/1982 | Frosch et al. | |
| 2006/0196535 A1* | 9/2006 | Swanson et al. | 136/244 |
| 2007/0212510 A1 | 9/2007 | Hieslmair et al. | |
| 2008/0042153 A1* | 2/2008 | Beeson et al. | 257/94 |
| 2008/0216887 A1 | 9/2008 | Hacke et al. | |
| 2008/0227236 A1 | 9/2008 | Luch | |
| 2009/0194162 A1* | 8/2009 | Sivaram et al. | 136/258 |
| 2010/0126573 A1 | 5/2010 | Youtsey et al. | |

(Continued)

OTHER PUBLICATIONS

PCT International Search Report and Written Opinion of the International Searching Authority for Application No. PCT/US2013/046830, dated Nov. 14, 2013, 9 sheets.

*Primary Examiner* — Keith Hendricks
*Assistant Examiner* — Kourtney Carlson
(74) *Attorney, Agent, or Firm* — Okamoto & Benedicto LLP

(57) ABSTRACT

One embodiment relates to a method of fabricating a solar cell. A silicon lamina is cleaved from the silicon substrate. The backside of the silicon lamina includes the P-type and N-type doped regions. A metal foil is attached to the backside of the silicon lamina. The metal foil may be used advantageously as a built-in carrier for handling the silicon lamina during processing of a frontside of the silicon lamina. Another embodiment relates to a solar cell that includes a silicon lamina having P-type and N-type doped regions on the backside. A metal foil is adhered to the backside of the lamina, and there are contacts formed between the metal foil and the doped regions. Other embodiments, aspects and features are also disclosed.

10 Claims, 11 Drawing Sheets

(56) References Cited

U.S. PATENT DOCUMENTS

| | | |
|---|---|---|
| 2010/0147364 A1 | 6/2010 | Gonzalez et al. |
| 2010/0200058 A1* | 8/2010 | Funakoshi .................... 136/256 |
| 2010/0243041 A1* | 9/2010 | Carlson et al. ............... 136/255 |
| 2011/0017263 A1 | 1/2011 | Gibson et al. |
| 2012/0018733 A1 | 1/2012 | Prabhakar |
| 2012/0090675 A1 | 4/2012 | Shim et al. |
| 2012/0103408 A1* | 5/2012 | Moslehi et al. .............. 136/256 |
| 2012/0125411 A1 | 5/2012 | Ragnow et al. |
| 2012/0204938 A1 | 8/2012 | Hacke et al. |

\* cited by examiner

1100

METAL-FOIL-ASSISTED FABRICATION OF THIN-SILICON SOLAR CELL

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load.

Solar cell fabrication processes typically include numerous steps involving masking, etching, deposition, diffusion, and other steps. Embodiments of the present invention provide advantageous solar cell processes.

BRIEF SUMMARY

One embodiment relates to a method of fabricating a solar cell. A silicon lamina is cleaved from the silicon substrate. The backside of the silicon lamina includes the P-type and N-type doped regions. A metal foil is attached to the backside of the silicon lamina. The metal foil may be used advantageously as a built-in carrier for handling the silicon lamina during processing of a frontside of the silicon lamina.

Another embodiment relates to a solar cell that includes a silicon lamina having P-type and N-type doped regions on the backside. A metal foil is adhered to the backside of the lamina, and there are contacts formed between the metal foil and the doped regions.

Another embodiment relates to a method of fabricating a solar cell that involves adhering a metal foil to a backside of a silicon substrate. A silicon lamina may then be separated from the backside of the silicon substrate. The metal foil is used as a built-in carrier for handling the silicon lamina during processing of a frontside of the silicon lamina.

These embodiments and other embodiments, aspects, and features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of apparatus, structures, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present disclosure provides techniques for forming thin-silicon solar cells using a metal foil. Advantageously, the metal foil may be used as a built-in carrier for handling the otherwise fragile silicon lamina during processing of a frontside of the lamina. Subsequently, the metal foil may be re-used to form metal fingers and contacts to the P-type and N-type emitters on the backside of the lamina.

Figure 1:
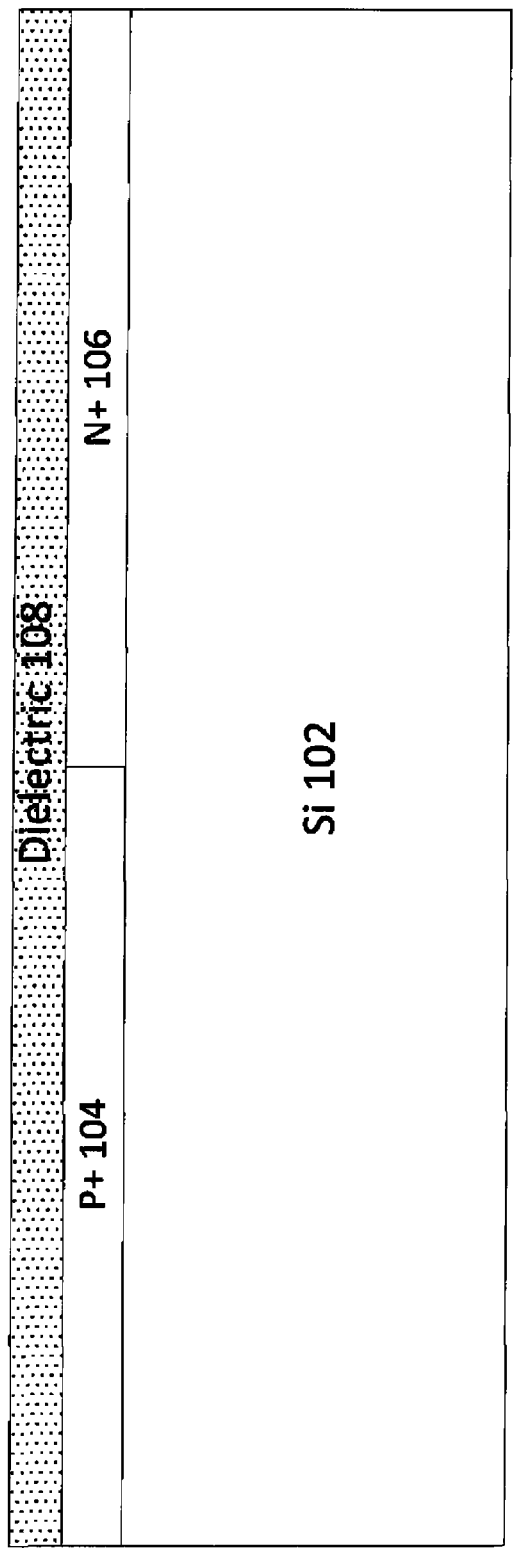
FIGS. 1-6 are cross-sectional views schematically illustrating fabrication of a solar cell in accordance with an embodiment of the present invention.

FIGS. 1-6 are cross-sectional views schematically illustrating fabrication of a thin-silicon solar cell in accordance with an embodiment of the present invention. Shown in FIG. 1 is a silicon substrate 102 having formed on it a P-type doped (P+) region 104 and an N-type doped (N+) region 106 formed on the backside of the substrate 102. The P+ and N+ doped regions may be referred to as P-type and N-type emitters in the context of the solar cell being fabricated. In the backside contact solar cell, which is shown in FIG. 1, the emitters and corresponding contacts are on the backside of the solar cell. The doped regions may be formed, for example, by diffusing dopants from dopant sources.

A thin dielectric layer 108 may be formed over the P+ and N+ regions on the backside for electrical insulation, passivation, and/or other purposes. The dielectric layer 108 may comprise, for example, silicon oxide and/or silicon nitride. Alternatively, the emitter surface may be passivated by means other than forming the dielectric layer 108, such as by chemical passivation, for example.

Figure 2:
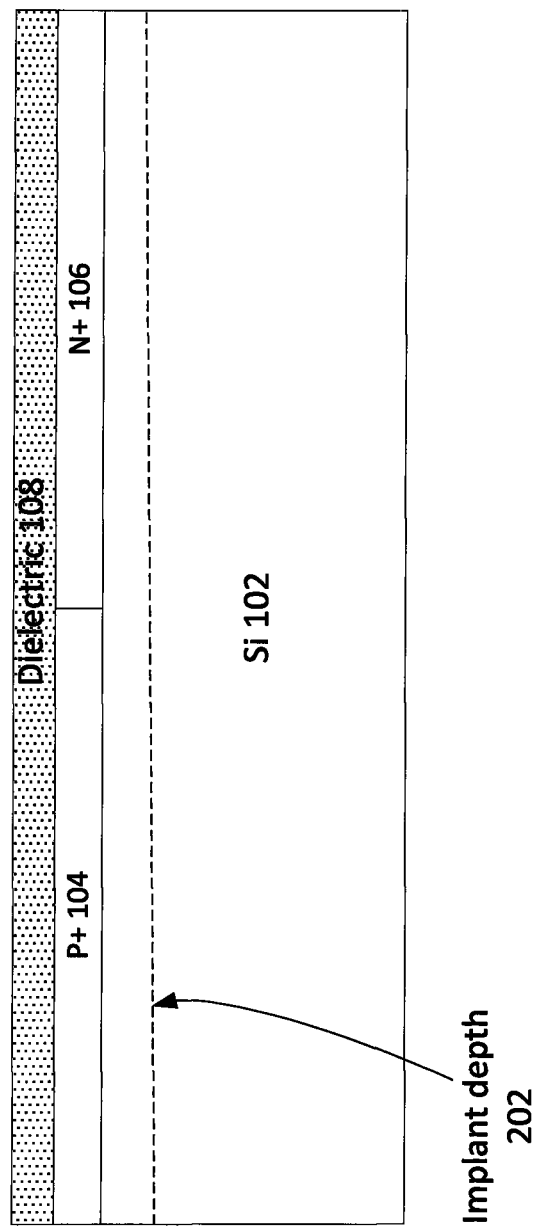

The solar cell structure of FIG. 1 may be placed in an ion implantation tool, which is also referred to as an "ion implanter." The implanter may be used to implant ions at a predetermined implant depth 202, as depicted in FIG. 2. The ions may be hydrogen ions (i.e. protons). In alternate embodiments, other ions may be implanted or co-implanted with the hydrogen. For example, helium ions may be implanted instead of hydrogen ions, or may be co-implanted with hydrogen ions. The dose of the implantation induces defects at the implant depth so that the planar lamina of silicon above the implant depth may be separated or exfoliated from the remainder of the silicon substrate below the implant depth. The energy of the implantation controls the implant depth and so controls the thickness of the thin silicon substrate after the exfoliation. For example, the energy of the implantation may be calibrated to cleave a thin lamina with a thickness within a range from 10 microns to 100 microns. The exfoliation may be accomplished by heating the substrate at an elevated temperature.

Figure 3:
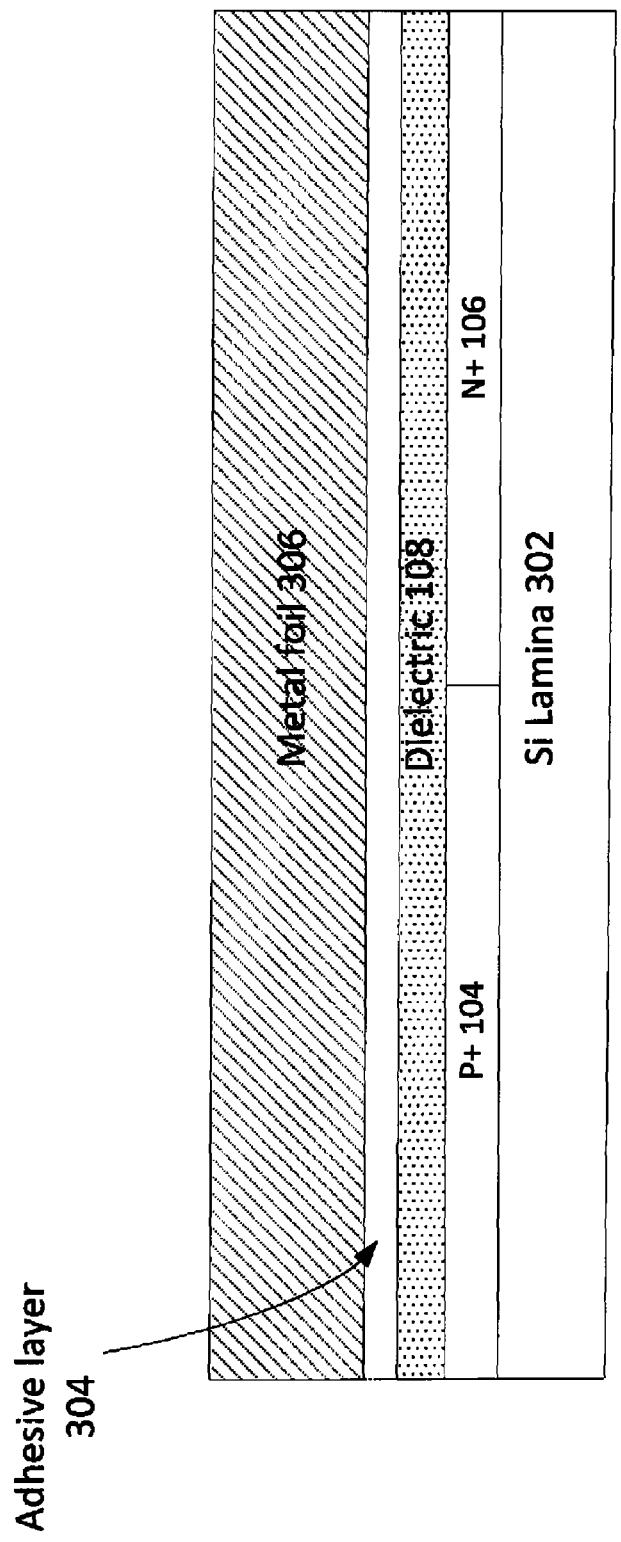

As depicted in FIG. 3, a metal foil 306 may be adhered to the dielectric layer 108 on the backside of the silicon lamina 302. The metal foil 306 may be an aluminum foil. To facilitate the foil being used as a carrier for the lamina, an extended area (handling area) of the metal foil 306 may extend beyond a perimeter of the silicon lamina 302. In an exemplary implementation, the composition of the metal foil 306 may be Al-1%Si (99% aluminum and 1% silicon), or more generally Al-x%Si, where x% is from 0% to 3%. Other compositions for aluminum foil may be used. It is also possible to use metal foils other than aluminum, such as silver foil, for example.

In one embodiment, an adhesive layer 304 may be used to adhere the metal foil 306 to the backside of the silicon lamina 302. The adhesive layer 304 may be a thin layer of epoxy, silicone, ethelyne vinyl acetate (EVA) or other encapsulant material which is applied to the backside of the substrate. In one implementation, the adhesive layer may be a coating pre-applied to the metal foil prior to the adhesion.

In an alternate embodiment, the metal foil 306 may be adhered to the backside of the substrate using an array of contact spots between the metal foil 306 and the backside of the substrate. The contact spots may be formed by spot melting of the metal foil using a pulsed laser, for example. In this embodiment, the adhesion layer 304 is not needed. Air gaps beneath the foil between the contact spots may be removed by flattening the foil.

Figure 4:
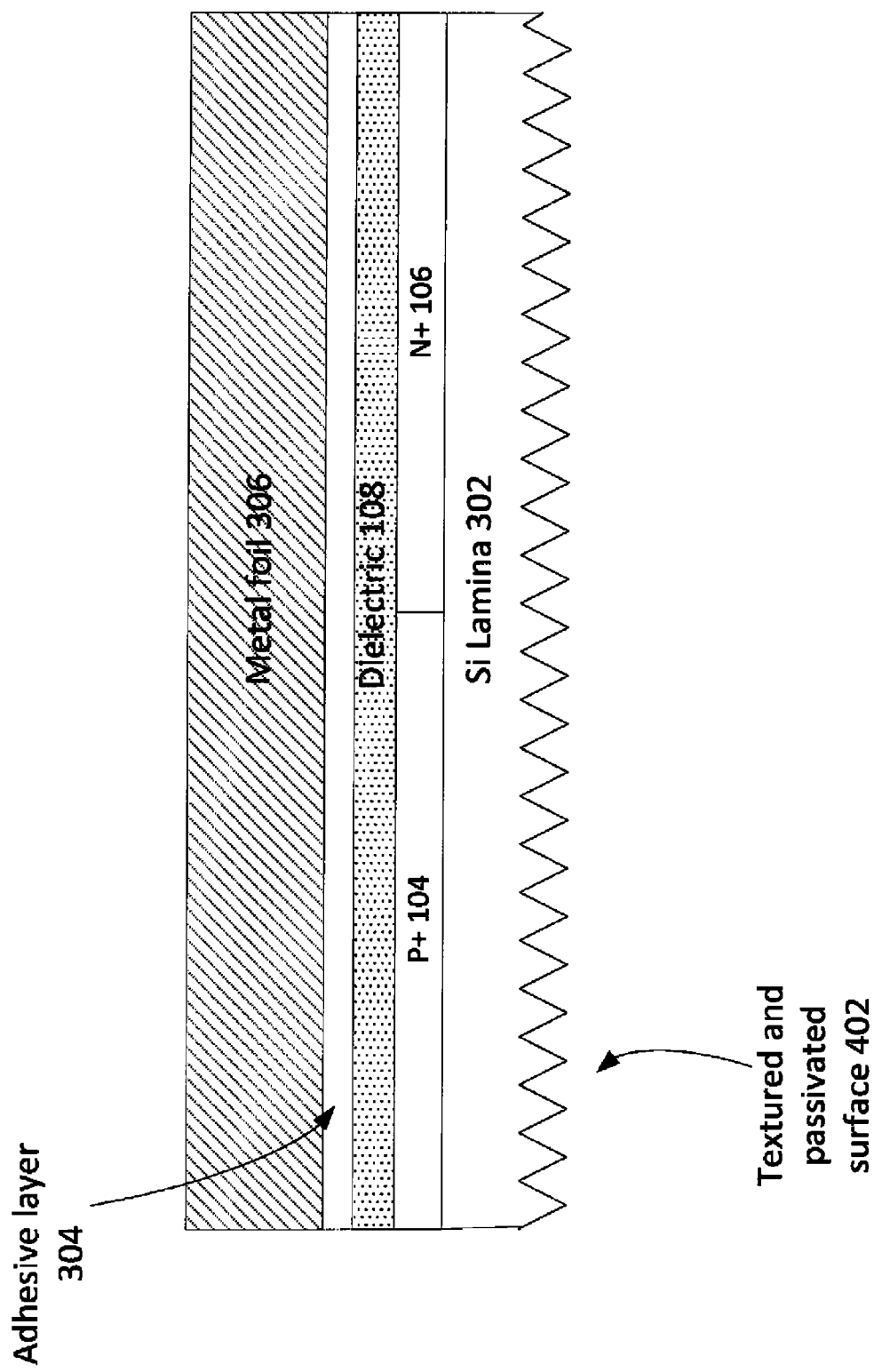

As depicted in FIG. 4, using the foil as a built-in or integrated carrier to support the lamina, the surface 402 at the front-side of the lamina 302 may then be textured and passivated. The surface texturing serves to increase the capacity of the silicon surface to absorb light, and the surface passivation serves to reduce charge recombination at the surface. The surface texturing may be accomplished using a wet surface etching process, for example. The surface passivation may be accomplished by chemical passivation or by other means.

Figure 5:
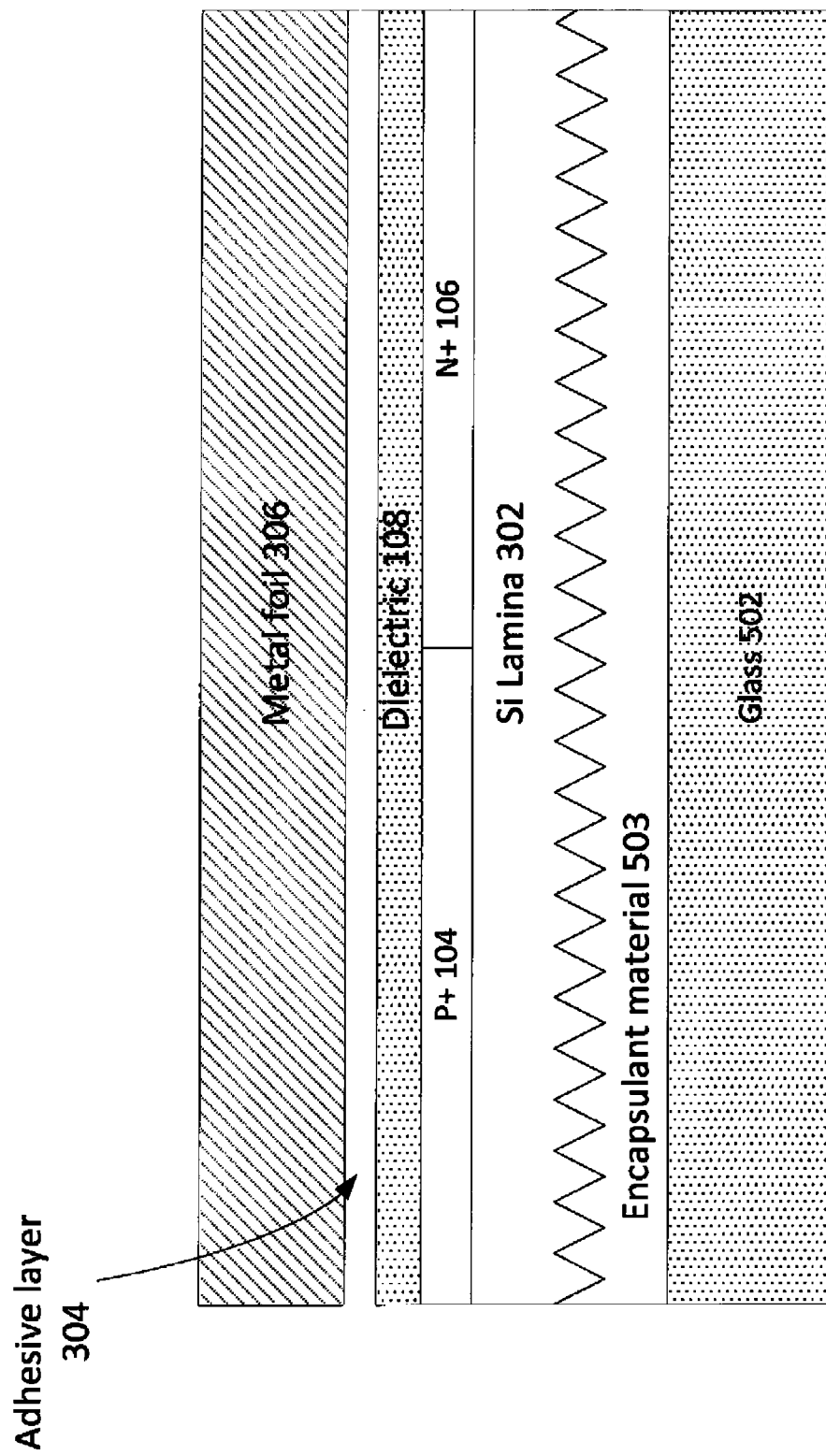

Thereafter, a glass encapsulation process may be performed on the frontside of the silicon lamina 302. FIG. 5 shows the resultant glass layer 502 which is attached to the frontside using encapsulant material 503.

Figure 6:
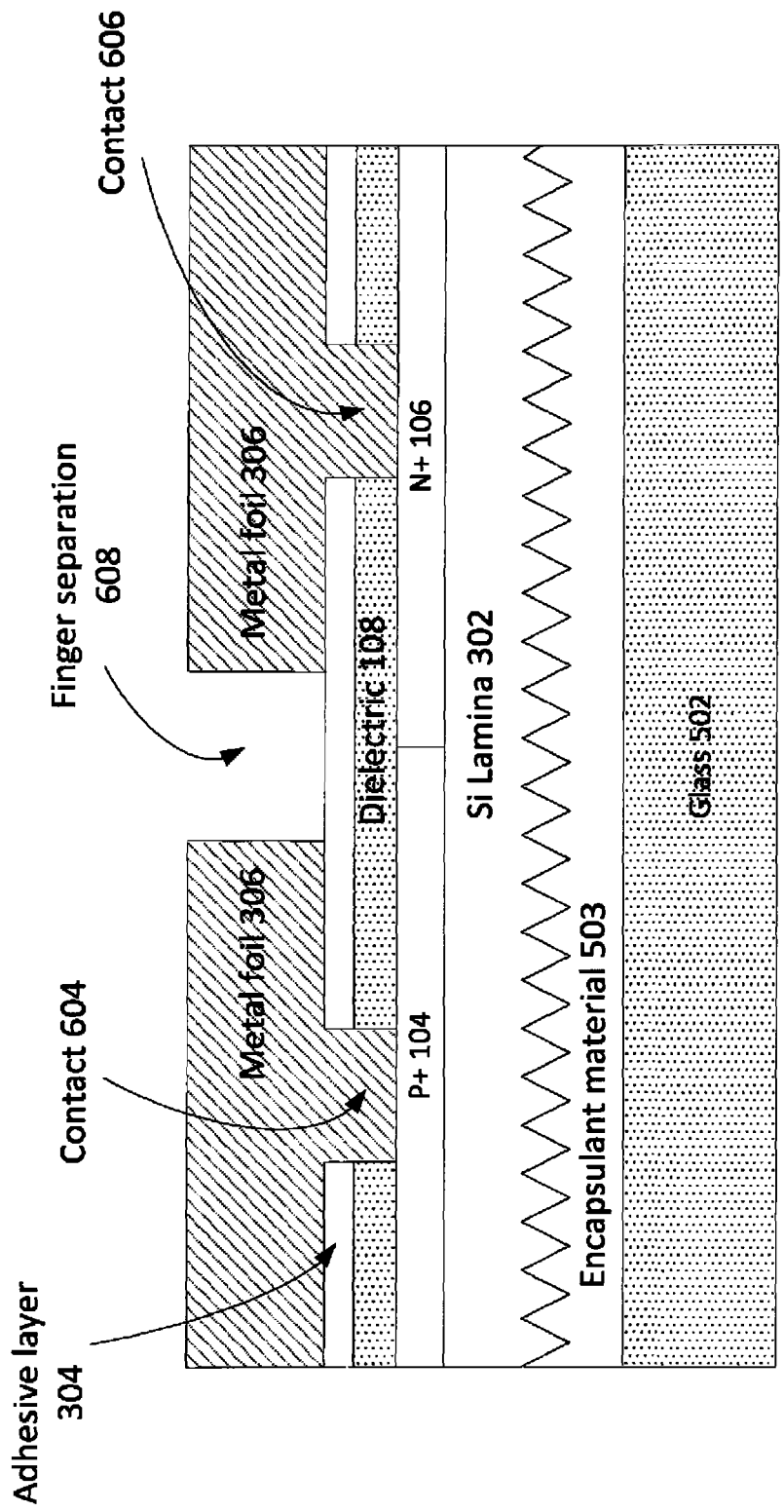

As shown in FIG. 6, further steps may then be performed on the backside of the silicon lamina 302. These steps include forming metal contacts 604 and 606 in contact holes to electrically couple to corresponding P+ regions 104 and N+ regions 106, respectively. A first set of metal contacts 604 may be from the metal foil 304 to the P+ region 104, and a second set of metal contacts 606 may be formed from the metal foil 304 to the N+ region 106. In one embodiment, the metal contacts 604 and 606 may be formed using a laser-based contact formation process. In such a process, a laser scanner may controllably scan a pulsed laser beam across the backside of the solar cell being fabricated. The pulsed laser beam may form the contact openings through the adhesive layer 304 and the dielectric layer 108, and the contact openings may be filled by melted metal from the foil 306.

In addition, a finger separation 608 pattern may be formed on the foil area to electrically separate the first set of metal contacts 604 from the second set of metal contacts 606. The finger separation 608 may be configured so that the fingers of the foil that lead to the contacts are interdigitated.

Figure 7:
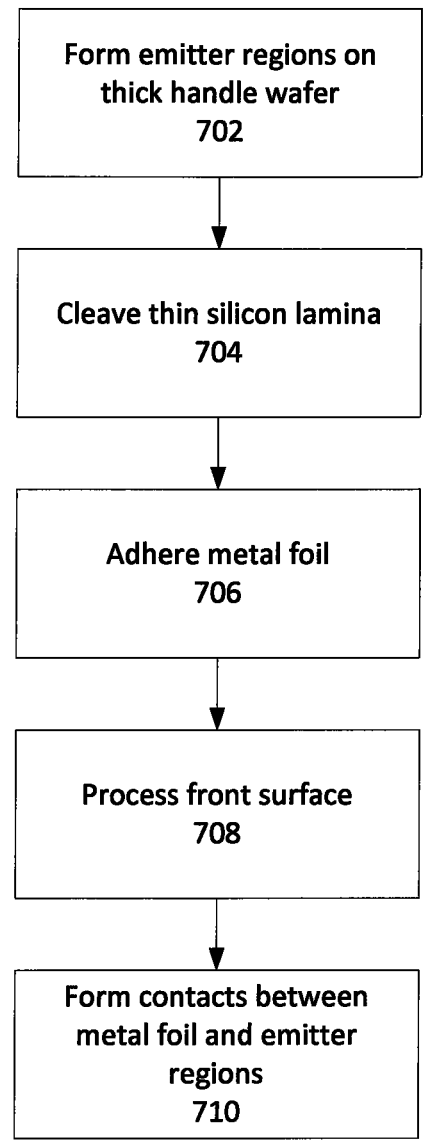
FIG. 7 is a flow diagram of a method of fabricating a solar cell in accordance with an embodiment of the present invention.

FIG. 7 is a flow diagram of an exemplary method 700 of fabricating a thin-silicon solar cell in accordance with an embodiment of the present invention. In the exemplary method 700 of FIG. 7, emitter regions may be first formed on a silicon wafer per block 702. The silicon wafer may be of a thickness of several hundred microns or more and may be referred to as a thick handle wafer. The emitter regions include both P-doped and N-doped regions and may be formed on the backside of the wafer as shown in FIG. 1.

Per block 704, a thin silicon lamina may be cleaved from the silicon wafer. For example, the silicon lamina may be of a thickness between 10 microns to 100 microns. In one implementation, the cleaving may be performed using ion implantation and exfoliation as described above in relation to FIG. 2. Alternatively, the cleaving may be performed by spalling or etching a sacrificial layer from the frontside of the wafer.

In block 706, metal foil may be adhered to the silicon lamina, as described above in relation to FIG. 3. In particular, the metal foil may be adhered to the backside surface of the silicon lamina. The metal foil may be of a thickness between 50 microns and 1 millimeter so as to provide mechanical support for the thin silicon lamina. To facilitate the foil being used as a carrier for the lamina, an extended area (handling area) of the metal foil may extend beyond a perimeter of the silicon lamina. In one implementation, the adhesion may be accomplished by using a laser to fire contacts between the metal foil and the silicon lamina. In another implementation, the adhesion may be accomplished using a thin adhesive layer coated on the metal foil.

Per block 708, the metal foil may be used as an integrated carrier for handling the silicon lamina so that the frontside surface of the silicon lamina may be processed. The frontside surface processing may include texturing and passivation, as described above in relation to FIG. 4. The surface texturing and passivation may be accomplished, for example, by dipping the lamina into chemical solutions to etch and passivate the frontside surface. Subsequently, the metal-foil-supported silicon lamina may have its frontside processed with a glass lamination procedure, as described above in relation to FIG. 5. Subsequent to the frontside processing, the extended area (handling area) of the metal foil may be trimmed.

Per block 710, contacts may be formed from the metal foil to the emitter regions. As described above in relation to FIG. 6, the contacts formed may include a first set of contacts 604 to P-doped emitter regions 104 and a second set of contacts 606 to N-doped emitter regions 106. In addition, a finger separation 608 pattern may be formed on the foil to electrically separate the first set and the second set of contacts.

Figure 8:
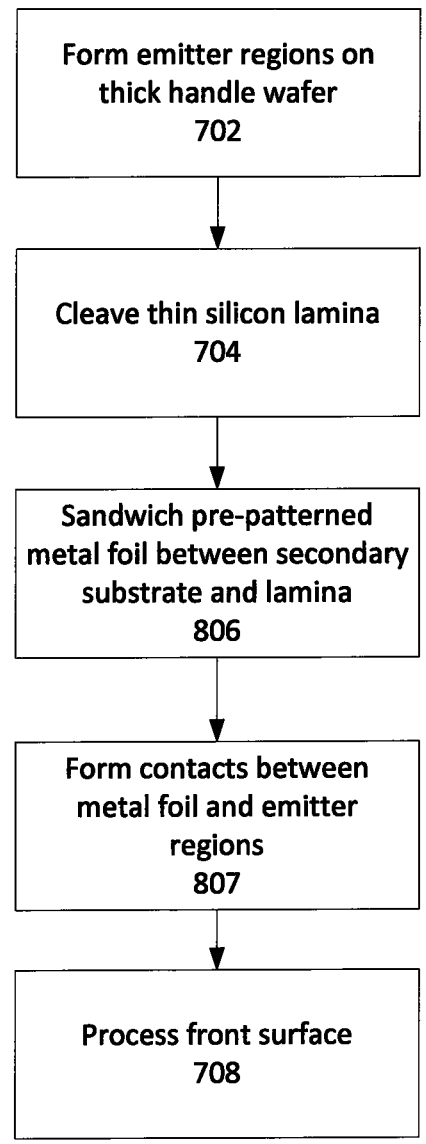
FIG. 8 is a flow diagram of a method of fabricating a solar cell in accordance with an alternate embodiment of the present invention.

In an alternate embodiment, instead of adhering a continuous metal foil layer to the backside and subsequently creating the finger separation pattern while the foil is attached to the backside, the finger separation pattern may be pre-formed in the metal foil before the metal foil is applied to the backside of the silicon lamina. FIG. 8 is a flow diagram of an alternate method 800 of fabricating a thin-silicon solar cell which uses such a pre-patterned metal foil in accordance with an embodiment of the present invention.

Figure 9:
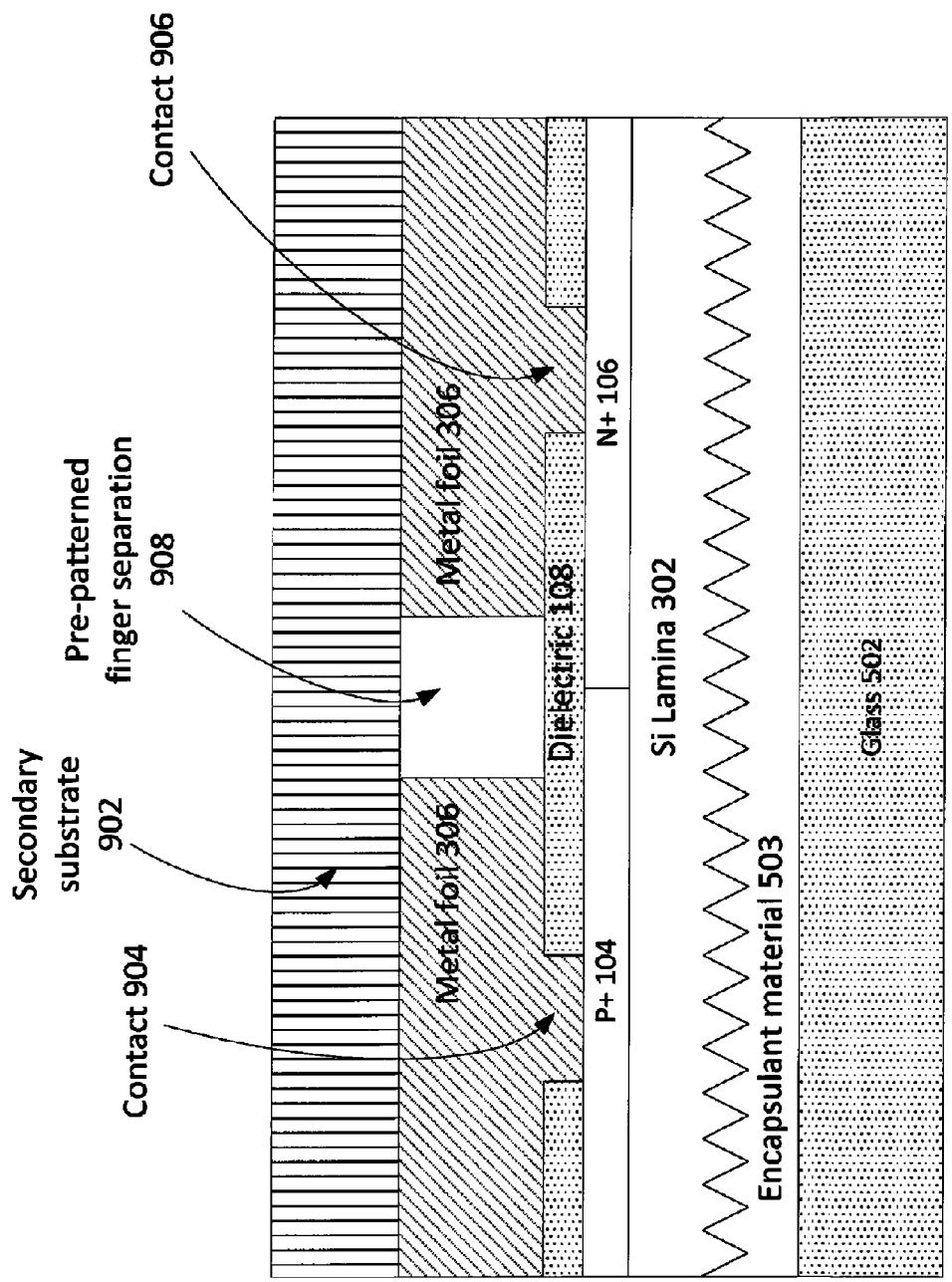
FIG. 9 is a cross-sectional view of a fabricated solar cell as fabricated in accordance with the method of FIG. 8.

As shown in FIG. 8, after the thin silicon lamina is cleaved from the wafer per block 704, a pre-patterned metal foil may be sandwiched 806 between the backside of the silicon lamina and a secondary substrate. The patterning of the metal foil achieves the finger separation between the P-type and N-type contacts. The secondary substrate may be transparent such that laser light may be transmitted through it. The secondary substrate may be, for example, a stiff polymer layer, such as a polyethylene terephthalate (PET) layer or a fluoropolymer layer. Thereafter, per block 807, the contacts may be formed between the metal foil and the emitter regions. The formation of the contacts may be accomplished, for example, using a pulsed laser which is transmitted through the secondary substrate to create the contact openings and flow melted metal from the foil into those openings. Per block 708, the front surface may then be processed, as described above in relation to FIG. 7. Subsequent to the frontside processing, the extended area (handling area) of the metal foil may be trimmed FIG. 9 is a cross-sectional view of a fabricated thin-silicon solar cell as fabricated in accordance with the method 800 of FIG. 8. As depicted in FIG. 9, the metal foil 306 with the pre-patterned finger separation 908 is sandwiched between the secondary substrate 902 and the backside of the silicon lamina 302. In addition, a P-type contact 904 and an N-type contact 906 are shown. As described above, these contacts may be formed by transmission of a pulsed laser through the transparent secondary substrate 902.

Figure 10:
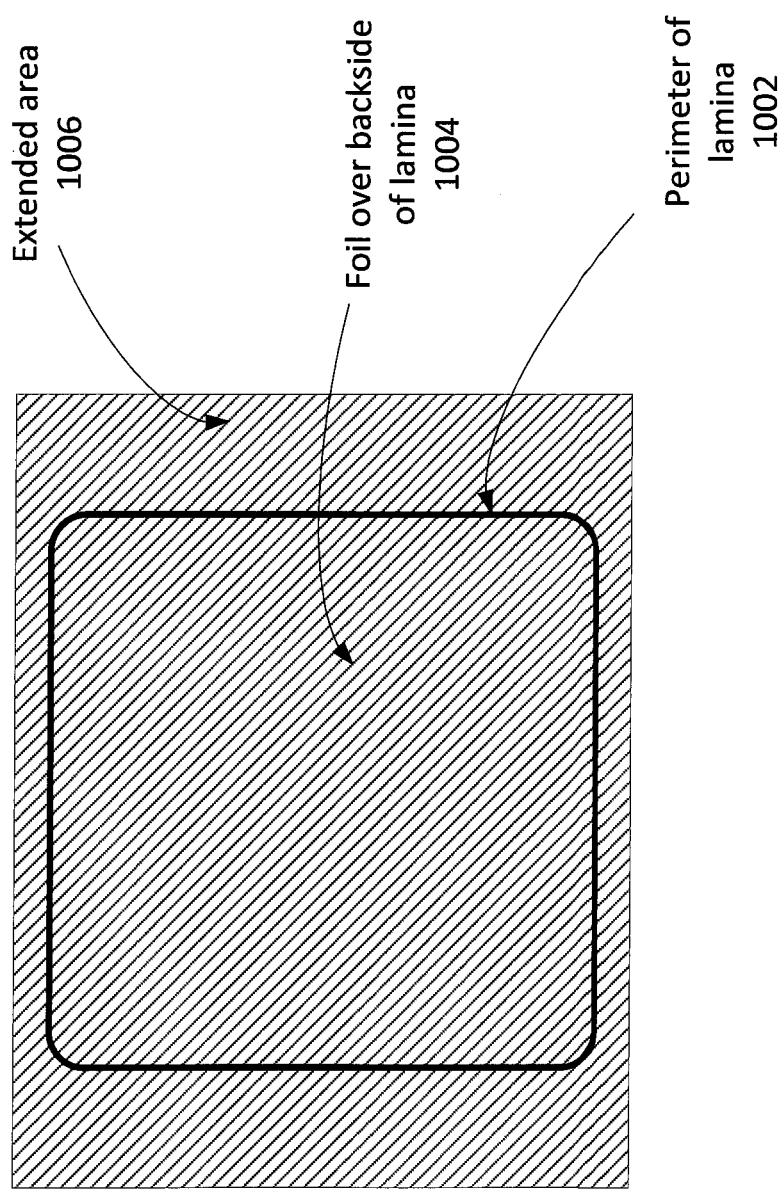
FIG. 10 is a planar view of a metal foil over the backside of a silicon lamina in accordance with an embodiment of the present invention.

FIG. 10 is a planar view of a metal foil over the backside of a silicon lamina in accordance with an embodiment of the present invention. The view of FIG. 10 shows a portion 1004 of the foil over the backside of the lamina and an extended area 1006 of the foil which extends beyond a perimeter 1002 of the lamina. Note that the extended area 1006 may extend over one or more sides of the perimeter and need not necessarily extend over all sides of the perimeter.

Figure 11:
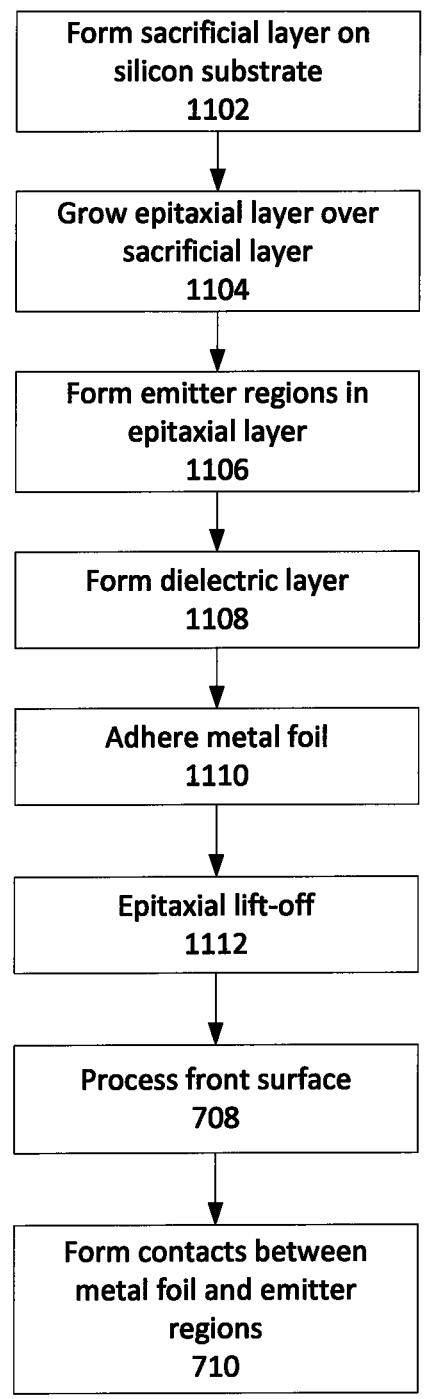
FIG. 11 is a flow diagram of a method of fabricating a thin-silicon solar cell in accordance with another embodiment of the present invention.

FIG. 11 is a flow diagram of a method 1100 of fabricating a thin-silicon solar cell in accordance with another embodiment of the present invention. In the exemplary method 1100 of FIG. 11, a sacrificial layer may be formed on a silicon substrate per block 1102.

The sacrificial layer may be composed of porous silicon, such as formed in a HF bath with bias. Alternatively, the sacrificial layer may be silicon with, for example, germanium doping and/or a carbon doping, either of which can be formed by epitaxial deposition or a chemical vapor deposition (CVD) process. The sacrificial layer may be thin, on the order of approximately 700 micrometers, although it may be slightly or significantly larger or smaller, as desired for a particular embodiment to perform the functions described herein. For example, in certain embodiments, the sacrificial layer may be as thin as 10 micrometers. Smaller thicknesses may also be used in certain instances.

An epitaxial layer of silicon may then be grown over the sacrificial layer per block 1104. The emitter regions may be formed in the epitaxial layer per block 1106, and a dielectric layer may be formed over the emitter regions per block 1108.

A metal foil may then be adhered over the emitter regions per block 1110. Subsequently, epitaxial lift-off per block 1112 may be performed by selective wet etching or otherwise removing the sacrificial layer. After lift-off, the epitaxial layer becomes the silicon lamina of the solar cell. A cross-sectional view of the structure at this point in the process corresponds to the view shown in FIG. 3. As disclosed herein, the metal foil provides structural support and an integrated carrier functionality to the silicon lamina.

Subsequently, the front surface may be processed per block 708. The contacts between the metal foil and the emitter regions may then be formed per block 710. In other words, after the epitaxial lift-off per block 1110, the processing may proceed as described above in relation to FIGS. 4-6.

Techniques for forming thin-silicon solar cells using a metal foil have been disclosed. Advantageously, the metal foil may be used as a built-in carrier for handling the otherwise fragile silicon lamina during processing of a frontside of the lamina. Subsequently, the metal foil may be re-used to form the P-type and N-type emitter contacts and metal fingers on the backside of the lamina.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a solar cell, the method comprising:
   cleaving a silicon lamina from a silicon substrate, wherein a backside of the silicon lamina includes P-type and N-type doped regions; and
   positioning a metal foil between a secondary substrate and the backside of the silicon lamina; and
   forming contacts between the metal foil and the doped regions by transmitting a pulsed laser through the secondary substrate.

2. The method of claim 1, wherein an extended area of the metal foil extends beyond a perimeter of the silicon lamina, further comprising:
   using the metal foil as an integrated carrier for handling the silicon lamina.

3. The method of claim 1, further comprising:
   forming a first set of contacts between the metal foil and the P-type doped regions; and
   forming a second set of contacts between the metal foil and the N-type doped regions.

4. The method of claim 1, further comprising:
   forming a finger separation pattern in the metal foil.

5. The method of claim 4, wherein the finger separation pattern is pre-formed in the metal foil prior to attachment to the backside.

6. The method of claim 5, further comprising:
   attaching the metal foil to a secondary substrate prior to attachment to the backside, wherein the secondary substrate is transparent to a laser light.

7. The method of claim 1, wherein the metal foil is attached to the backside using an adhesive layer.

8. The method of claim 1, wherein the metal foil is attached to the backside at an array of contact spots between the metal foil and the backside of the silicon substrate, and wherein the contact spots are formed by spot melting of the metal foil.

9. The method of claim 1, wherein the metal foil comprises aluminum.

10. The method of claim 1, further comprising:
    texturing and passivating a frontside of the silicon lamina while using the metal foil as the carrier for handling the silicon lamina; and
    encapsulating the frontside of the silicon lamina.

* * * * *